(12) United States Patent
Briseno-Vidrios

(10) Patent No.: US 11,705,930 B2
(45) Date of Patent: *Jul. 18, 2023

(54) MEASUREMENT AND CALIBRATION OF MISMATCH IN AN ISOLATION CHANNEL

(71) Applicant: Skyworks Solutions, Inc., Irvine, CA (US)

(72) Inventor: Carlos J. Briseno-Vidrios, Austin, TX (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/038,211

(22) Filed: Sep. 30, 2020

(65) Prior Publication Data
US 2022/0103196 A1    Mar. 31, 2022

(51) Int. Cl.
*H04B 1/10* (2006.01)
*H04B 1/12* (2006.01)
(Continued)

(52) U.S. Cl.
CPC ....... *H04B 1/1027* (2013.01); *H03F 3/45475* (2013.01); *H03G 3/3089* (2013.01); *H03K 19/017509* (2013.01); *H04B 1/123* (2013.01); *H04B 1/1615* (2013.01); *H03G 2201/103* (2013.01)

(58) Field of Classification Search
CPC .... G01R 31/002; G01R 31/003; G01R 31/28; G01R 31/2853; H01R 13/6461; H04B 1/1027; H04B 1/123; H04B 1/1615; H04L 25/0268; H04L 25/0266; H03K 17/689; H03K 19/017509; H03F 3/45475; H03G 3/3089; H03G 2201/103
See application file for complete search history.

(56) References Cited

U.S. PATENT DOCUMENTS 4,570,128 A    2/1986   Monticelli
7,902,627 B2   3/2011   Dong et al.
(Continued)

FOREIGN PATENT DOCUMENTS

CN    109246160 B  *  1/2022  ......... H04L 61/1588

OTHER PUBLICATIONS

U.S. Appl. No. 17/106,358 Issued as U.S. Pat. No. 11,356,135, filed Nov. 30, 2020, Measurement Circuit for Isolation Product.
(Continued)

*Primary Examiner* — Sophia Vlahos
(74) *Attorney, Agent, or Firm* — Knobbe, Martens, Olson & Bear, LLP

(57) ABSTRACT

A method for calibrating an isolator product includes receiving a calibration signal on a differential pair of nodes of a receiver signal path of a first integrated circuit die of the isolator product. The method includes generating a diagnostic signal having a level corresponding to an average amplitude of the calibration signal on the differential pair of nodes. The method includes configuring a programmable receiver signal path based on the diagnostic signal. Generating the diagnostic signal may include providing an analog signal based on a full-wave rectified version of the calibration signal on the differential pair of nodes. Generating the diagnostic signal may include converting the analog signal to a digital signal.

17 Claims, 13 Drawing Sheets

(51) Int. Cl.
  *H04B 1/16* (2006.01)
  *H03F 3/45* (2006.01)
  *H03G 3/30* (2006.01)
  *H03K 19/0175* (2006.01)

(56) References Cited

U.S. PATENT DOCUMENTS

| | | | |
|---|---|---|---|
| 8,169,108 B2 | 5/2012 | Dupuis et al. | |
| 8,198,951 B2 | 6/2012 | Dong et al. | |
| 8,441,325 B2 | 5/2013 | Callahan et al. | |
| 8,478,332 B2 | 7/2013 | Giombanco et al. | |
| 9,564,863 B1 | 2/2017 | Giridharan | |
| 9,634,646 B1 * | 4/2017 | Ha | H03H 11/28 |
| 9,755,599 B2 | 9/2017 | Yuan et al. | |
| 9,929,854 B2 | 3/2018 | Laughlin et al. | |
| 10,326,375 B1 | 6/2019 | Pentakota et al. | |
| 10,840,960 B1 * | 11/2020 | Al-Shyoukh | H04B 1/16 |
| 10,942,217 B2 * | 3/2021 | Al-Shyoukh | G01R 31/2853 |
| 11,356,135 B2 | 6/2022 | Briseno-Vidrios | |
| 2001/0041548 A1 | 11/2001 | Bult | |
| 2003/0218502 A1 | 11/2003 | MacTaggart et al. | |
| 2004/0219898 A1 | 11/2004 | Bult | |
| 2005/0285674 A1 | 12/2005 | Zaguri | |
| 2008/0139149 A1 | 6/2008 | Mu et al. | |
| 2010/0141340 A1 | 6/2010 | Huang et al. | |
| 2013/0027110 A1 | 1/2013 | Beale | |
| 2013/0207722 A1 | 8/2013 | Bulzacchelli | |
| 2013/0286864 A1 * | 10/2013 | Karam | G01R 19/16566 370/252 |
| 2015/0288144 A1 | 10/2015 | Raj et al. | |
| 2016/0080183 A1 | 3/2016 | Yun et al. | |
| 2018/0323759 A1 | 11/2018 | Cojocaru | |
| 2018/0348295 A1 | 12/2018 | Stroud et al. | |
| 2019/0068410 A1 | 2/2019 | Al-Shyoukh et al. | |
| 2019/0068417 A1 * | 2/2019 | Rehman | H04L 27/2071 |
| 2019/0181817 A1 | 6/2019 | Al-Shyoukh et al. | |
| 2022/0103145 A1 * | 3/2022 | Briseno-Vidrios | H04B 1/1027 |
| 2022/0103197 A1 | 3/2022 | Briseno-Vidrios | |
| 2022/0286154 A1 | 9/2022 | Briseno-Vidrios | |

OTHER PUBLICATIONS

U.S. Appl. No. 17/038,223 Issued as U.S. Pat. No. 11,569,852, filed Sep. 30, 2020, Peak and Gain Calibration of a Receiver in an Isolation Product.

U.S. Appl. No. 17/826,469 Published as 2022/0286154 A1, filed May 27, 2022, Measurement Circuit for Isolation Product.

* cited by examiner

MEASUREMENT AND CALIBRATION OF MISMATCH IN AN ISOLATION CHANNEL

CROSS-REFERENCE TO RELATED APPLICATION(S)

This application is related to U.S. patent application Ser. No. 17/038,223, filed on Sep. 30, 2020, entitled "PEAK AND GAIN CALIBRATION OF A RECEIVER IN AN ISOLATION PRODUCT," and naming Carlos J. Briseno-Vidrios and Gabor Marek as inventors, which application is incorporated herein by reference.

BACKGROUND

Field of the Invention

The invention relates to isolation technology and more particularly to an isolation product including a communications channel across an isolation barrier.

Description of the Related Art

In a typical control application, a processor system provides one or more control signals for controlling a load system. During normal operation, a large DC or transient voltage difference may exist between the domain of the processor system and the domain of the load system, thus requiring an isolation barrier between the processor system and the load system. For example, one domain may be grounded at a voltage that is switching with respect to earth ground by hundreds or thousands of Volts. Accordingly, an intermediate system includes isolation that prevents damaging currents from flowing between the processor system and the load system. Although the isolation prevents the processor system from being coupled to the load by a direct conduction path, an isolation channel allows communication between the two systems using optical (opto-isolators), capacitive, inductive (transformers), or electromagnetic techniques. However, such communication is susceptible to common mode transients that can interfere with the accuracy of the information transmitted across the isolation channel. Thus, isolation technology with immunity to common mode transients is desirable.

SUMMARY OF EMBODIMENTS OF THE INVENTION

In at least one embodiment of the invention, a method for calibrating an isolator product includes receiving a calibration signal on a differential pair of nodes of a receiver signal path of a first integrated circuit die of the isolator product. The method includes generating a diagnostic signal having a level corresponding to an average amplitude of the calibration signal on the differential pair of nodes. The method includes configuring a programmable receiver signal path based on the diagnostic signal. Generating the diagnostic signal may include providing an analog signal based on a full-wave rectified version of the calibration signal on the differential pair of nodes. Generating the diagnostic signal may include converting the analog signal to a digital signal.

In at least one embodiment of the invention, an isolator product includes a first integrated circuit die including a receiver signal path having a diagnostic mode of operation and a normal mode of operation. The receiver signal path is selectively configured to receive a calibration signal on a differential pair of nodes in response to the isolator product being configured in the diagnostic mode of operation. The receiver signal path is selectively configured using a stored configuration in response to the isolator product being configured in the normal mode of operation. The isolator product includes a circuit coupled to the receiver signal path and selectively configured to generate a diagnostic signal having a level corresponding to an average amplitude of the calibration signal in response to the isolator product being configured in the diagnostic mode of operation, the stored configuration being based on the diagnostic signal.

In at least one embodiment of the invention, a method for calibrating an isolator product includes compensating for mismatch of an isolation channel coupled between a differential pair of receiver nodes of a first integrated circuit die of the isolator product and a differential pair of transmitter nodes of a second integrated circuit die of the isolator product based on a diagnostic signal generated by the isolator product in a diagnostic mode of operation. The diagnostic signal is indicative of the mismatch. The compensating may include configuring a programmable receiver signal path of first integrated circuit die based on the diagnostic signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
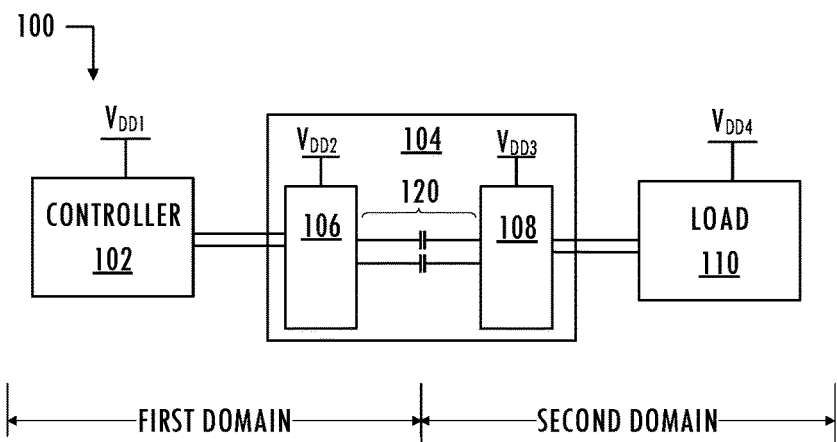
FIG. 1 illustrates a functional block diagram of an exemplary control system including an isolator product.
Figure 2:
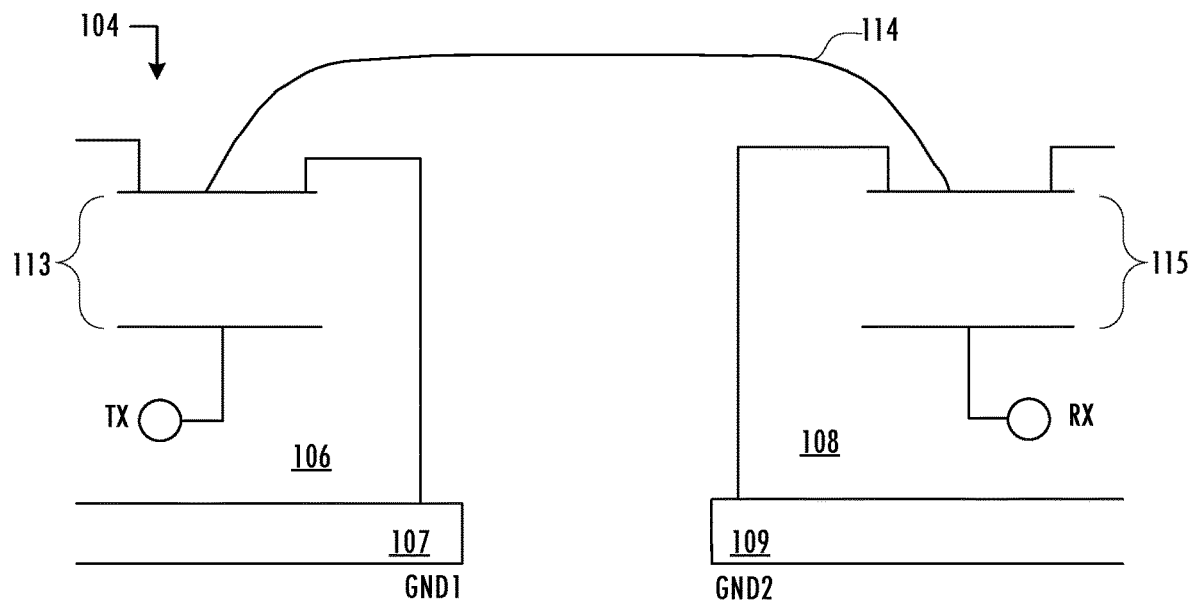
FIG. 2 illustrates a cross-sectional view of an exemplary packaged isolator product including a capacitive isolation barrier.

Referring to FIGS. 1 and 2, in an exemplary control application, controller 102, which may be a microprocessor, microcontroller, or other suitable processing device, operates in a first domain (i.e., a voltage domain including $V_{DD1}$, e.g., 5 Volts (V)) and communicates with load system 110 operating in a second domain (i.e., a voltage domain including $V_{DD4}$, e.g., 150 V) using isolator 104. Isolator 104 preserves isolation between the domains on a first side of system 100, e.g., the first domain including $V_{DD1}$ (e.g., less than ten volts) and $V_{DD2}$ (e.g., less than ten volts) and devices coupled thereto, and a second side of system 100, e.g., the second domain including $V_{DD3}$ (e.g., tens of Volts) and $V_{DD4}$ (e.g., hundreds of Volts) and devices coupled thereto. For example, the first and second domains of isolator 104 are physically separate while isolator 104 provides a reliable communications channel between the first and second domains.

Isolation channel 120 facilitates safe communication of a signal received from controller 102 in the first domain across an isolation barrier to load 110 of the second domain via integrated circuit die 106 and integrated circuit die 108. Similarly, isolator 104 may safely provide at least one feedback signal from load 110 to controller 102 via isolation channel 120. The second domain includes driver circuitry (e.g., included in integrated circuit die 108) that generates an output control signal based on the signal received from the first domain and provides a suitable drive signal to load 110. In an exemplary embodiment of isolator 104, integrated circuit die 106 is attached to lead frame 107 and integrated circuit die 108 is attached to lead frame 109. Each integrated circuit die includes integrated circuit terminals coupled to isolation channel 120. Integrated circuit die 106, integrated circuit die 108, and isolation channel 120 are packaged as a single device.

In at least one embodiment of system 100, isolation channel 120 blocks DC signals and only passes AC signals. Isolation channel 120 is described as including capacitive isolation, although other suitable isolation techniques may be used. Capacitor 113 and capacitor 115 may be integrated with integrated circuit die 106 and integrated circuit die 108, respectively, and coupled to each other via bond wire 114. Capacitor 113 and capacitor 115 may each include a bottom plate formed in a first conductive semiconductor layer (e.g., metal-1), a top plate formed in a second conductive semiconductor layer (e.g., metal-7) above the first conductive semiconductor layer, and a dielectric material (e.g., silicon dioxide) formed between the top and bottom plates.

An exemplary isolation channel 120 uses digital modulation, e.g., on-off keying (OOK) modulation, to communicate one or more digital signals between integrated circuit die 106 and integrated circuit die 108, although other communication protocols may be used. In general, on-off keying modulation is a form of amplitude-shift keying modulation that represents digital data as the presence or absence of a carrier wave or oscillating signal having carrier frequency $f_c$ (e.g., 300 MHz≤$f_c$≤1 GHz). The presence of the carrier for a specified duration represents a binary one, while its absence for the same duration represents a binary zero. This type of signaling is robust for isolation applications because a logic '0' state sends the same signal (e.g., nothing) as when the first domain loses power and the device gracefully assumes its default state. That behavior is advantageous in driver applications because it will not accidentally turn on the load device, even when the first domain loses power. However, isolator 104 may communicate other types of signals (e.g., pulse width modulated signals or other types of amplitude shift keying modulated signals) across isolation channel 120. The digital modulation scheme used may be determined according to performance specifications (e.g., signal resolution) and environment (e.g., probability of transient events) of the target application.

In at least one embodiment of isolator 104, integrated circuit die 106 receives a digital signal, e.g., asynchronously to an internal clock, and generates a modulated representation of the digital signal. Integrated circuit die 106 generates a carrier clock signal having carrier frequency $f_c$ that is much greater than a frequency associated with data of the digital signal. By driving a differential pair of signals representing the data on a capacitively coupled conductor of isolation channel 120, integrated circuit die 106 provides integrated circuit die 108 with a representation of the data. Integrated circuit die 108 includes a receiver signal path that amplifies a received differential pair of signals and demodulates the received differential pair of signals to recover the data from the received differential pair of signals. Integrated circuit die 108 includes a low-noise amplifier coupled in series with a signal conditioning circuit and a demodulator. An exemplary demodulator includes a rectifier circuit that generates a full-wave-rectified (FWR) signal and removes the carrier signal to provide a root mean square (RMS) proportional signal. In at least one embodiment, integrated circuit die 108 includes a comparator that resolves the RMS output of the rectifier circuit into a recovered digital signal.

Figure 3:
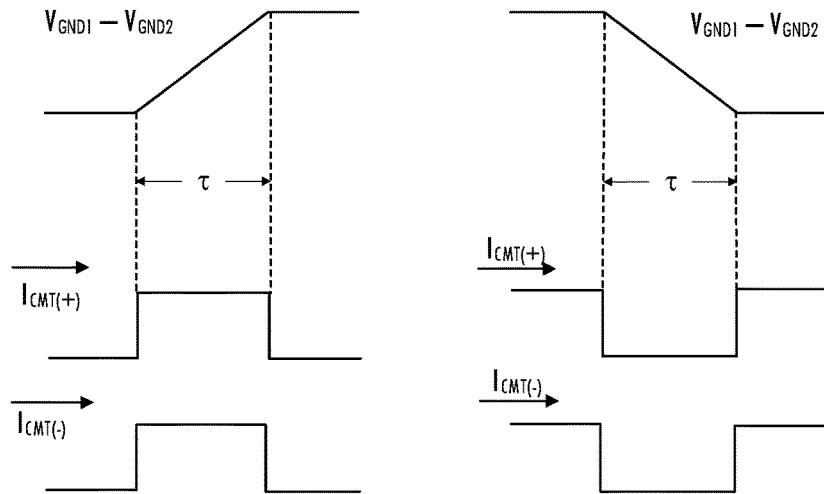
FIG. 3 illustrates exemplary waveforms for an exemplary capacitive isolation channel.
Figure 4:
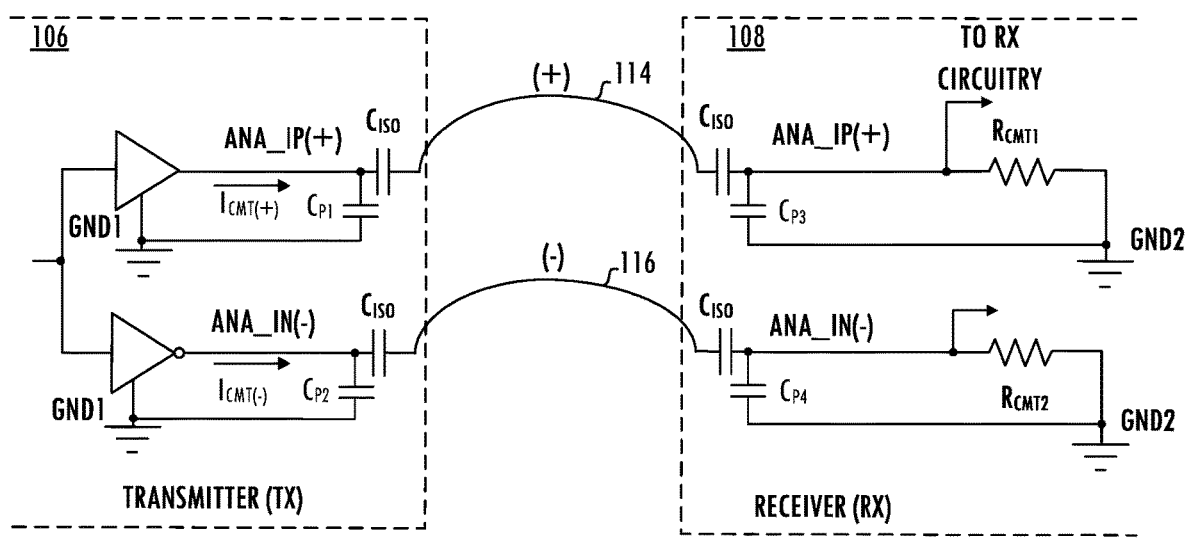
FIG. 4 illustrates a circuit diagram for an exemplary capacitive isolation channel.

Referring to FIGS. 3 and 4, isolator 104 transfers information between two exemplary ground domains that could be thousands of Volts apart. Further, the ground domains could be moving relative to each other at extremely fast voltage transients of approximately 100 KV/μs. A conventional isolator product includes multiple differential channels, each including a differential pair of terminals. Each differential pair of terminals includes an inverting terminal ANA_IN and a non-inverting terminal ANA_IP on integrated circuit die 106 and are coupled by bond wires 114 and 116 to corresponding terminals of integrated circuit die 108.

Transients caused by relative differences between the ground of integrated circuit die 106 (GND1) relative to the second ground of integrated circuit die 108 (GND2) are referred to as common mode transient events. Ideally, circuit components are perfectly matched and a common mode transient event does not cause a differential event between differential pair of terminals ANA_IP (+) and ANA_IN (−). However, in practice, mismatch of actual circuit elements and bond wire mismatch in the differential path and other factors cause a common mode transient current to generate a differential pulse at the input of integrated circuit die 108.

Mismatch of equivalent parasitic capacitance on the inverting terminal and equivalent parasitic capacitance on the non-inverting terminal of a differential pair of terminals may result from manufacturing process variations or physical design of integrated circuit die 106. In at least one embodiment, equivalent parasitic capacitance includes parasitic capacitance associated with bond wires referred to driver outputs. Mismatch between capacitance $C_{ISO\_N}$ and capacitance $C_{ISO\_P}$ limit the common mode transient immunity (CMTI) of isolator 104 because a non-negligible parasitic capacitance mismatch causes a non-negligible voltage based on any common mode transient noise signal to be supplied concurrently to both the inverting terminal and the non-inverting terminal of a differential pair of terminals. Similarly, mismatch of equivalent parasitic capacitance $C_{P3}$ and equivalent parasitic capacitance $C_{P4}$ on the corresponding terminals of the differential pairs of terminals of integrated circuit die 108 limit the ability of isolator 104 to reject fast common mode transient noise signals. A common mode transient event may cause a substantial common mode transient current $I_{CMT}$ to flow through the isolation barrier capacitors $C_{ISO}$. Mismatch between positive common mode transient current $I_{CMT}(+)$ and negative common mode transient current $I_{CMT}(-)$ forms a differential pulse. As a result of this mismatch, mismatched voltages develop across resistor $R_{CMT1}$ and resistor $R_{CMT2}$ and create a voltage difference (i.e., a differential signal) between resistor $R_{CMT1}$ and resistor $R_{CMT2}$. That differential pulse can corrupt a digital signal recovered by receiver circuitry in integrated circuit die 108.

Figure 5:
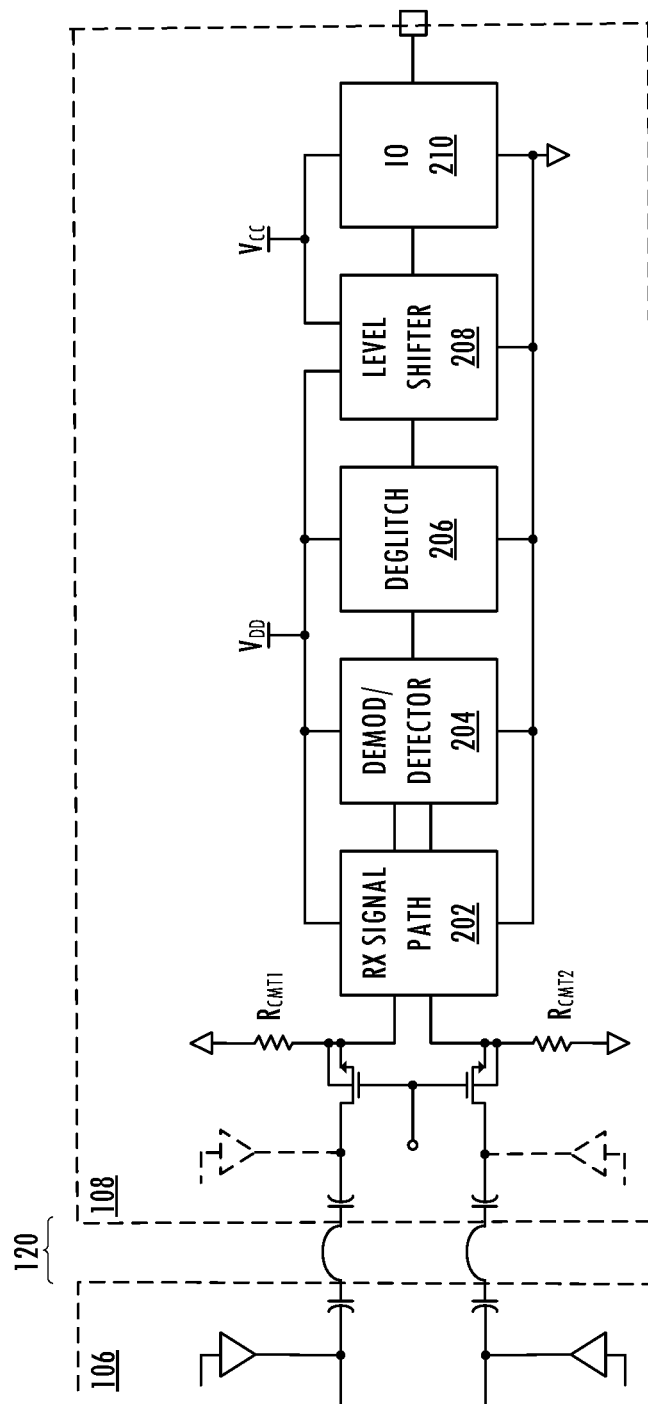
FIG. 5 illustrates a functional block diagram of an exemplary isolation channel of an exemplary isolator product.

FIG. 5 illustrates a functional block diagram of an exemplary receiver of integrated circuit die 108 of isolator 104. Receiver signal path 202 amplifies the signal received on a differential pair of terminals via isolation channel 120. In general, receiver signal path 202 has a bandpass characteristic with a maximum gain peak at the carrier frequency. Demodulator/detector 204 removes the carrier signal and recovers the digital data transmitted using the carrier signal. In at least one embodiment of integrated circuit die 108, the receiver signal path includes deglitcher 206, which filters out short duration glitches. In other embodiments of integrated circuit die 108 (e.g., in low-CMT applications), deglitcher 206 is omitted. Level shifter 208 converts the recovered digital signal from a low-voltage domain (e.g., power supply voltage $V_{DD}$ that is generated by a subregulator) to a high voltage, main power domain (e.g., main power supply $V_{CC}$ on the integrated circuit 108). Input/output 210 converts the recovered digital signal into a voltage format compatible with the load and drives the converted signal to a load that is external to integrated circuit 108.

Figure 6:
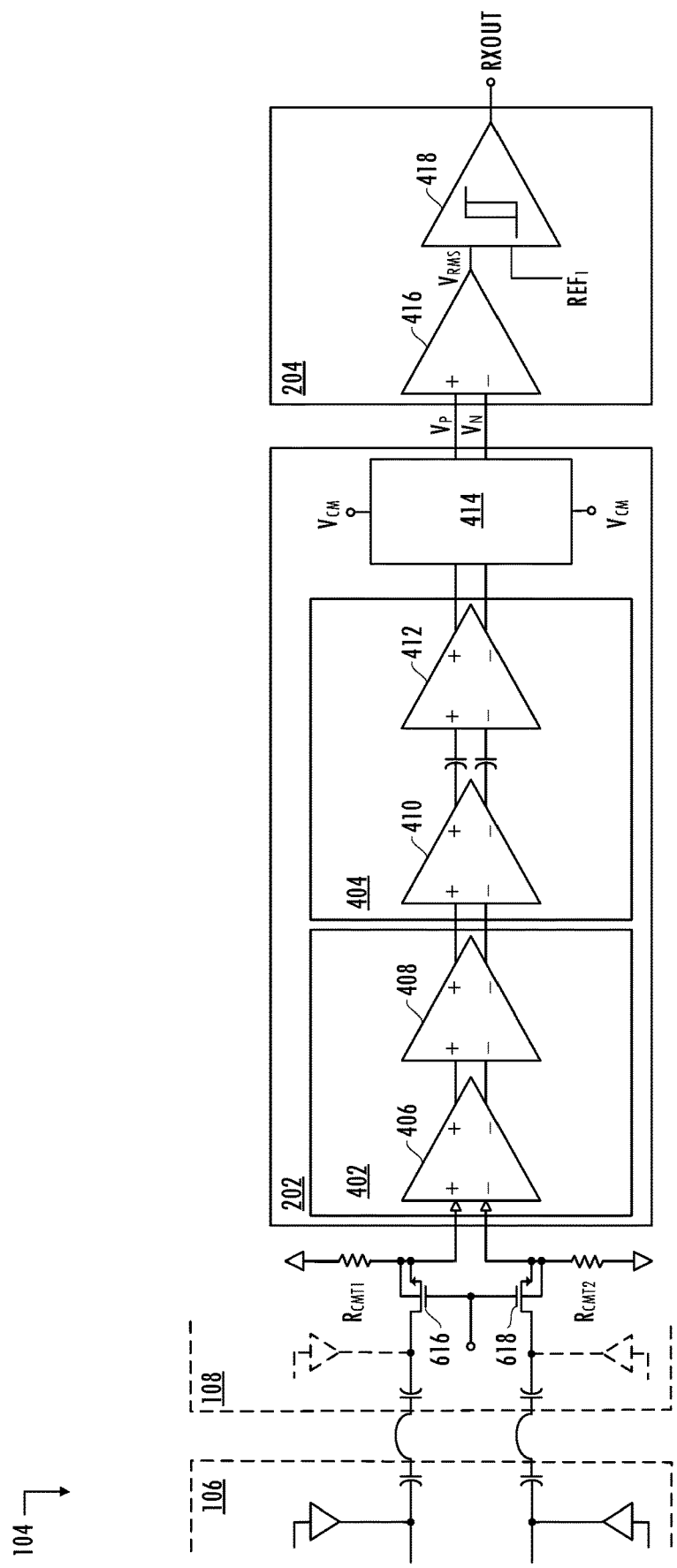
FIG. 6 illustrates a circuit diagram of a portion of the exemplary isolation channel of FIG. 5, consistent with at least one embodiment of the isolator product.

FIG. 6 illustrates a circuit diagram of a portion of the exemplary receiver signal path of FIG. 5 consistent with at least one embodiment of the isolator product. The receiver front end includes transistor 616, transistor 618, resistor $R_{CMT1}$, resistor $R_{CMT2}$, and front-end circuit 402. Front-end circuit 402 includes peaking gain stage 406 and peaking gain stage 408. In at least one embodiment, transistors 616 and 618 are omitted. The function of the receiver front end is to amplify the received differential pair of signals that develops between resistor $R_{CMT1}$ and resistor $R_{CMT2}$ while tolerating massive common mode transient signals.

In at least one embodiment of receiver signal path 202, peaking gain stage 408 directly drives (i.e., without buffering) variable peaking gain stage 404, which further amplifies the signal. Variable peaking gain stage 404 includes programmable flat gain stage 410 with a frequency response having a flat pass band (i.e., a gain that has negligible variation with respect to frequency) and drives peaking gain stage 412, which is coupled to high pass filter 414. High pass filter 414 removes output-referred offsets created by peaking gain stage 412. High-pass filter 414 uses a local common mode voltage generator to center differential pair of signals $V_P$ and $V_N$ around a common mode voltage suitable for demodulator/detector 204.

Demodulator/detector 204 functions as a 1-bit discriminator that generates a 1-bit output signal based on comparing the signal to predetermined threshold voltage $V_{REF1}$. In at least one embodiment, measurement circuit 416 provides a measurement (e.g., an RMS voltage signal, measurement $V_{RMS}$) based on the signal on differential pair of nodes $V_P$ and $V_N$. If the equivalent average signal is less than predetermined threshold voltage $V_{REF1}$, then demodulator/detector 204 causes output signal RXOUT to have a logic '0' signal level. If the equivalent average signal is greater than predetermined threshold voltage Vi, then demodulator/detector 204 causes output signal RXOUT to have a logic '1' signal level. Predetermined threshold voltage $V_{REF1}$ is defined as $V_{CM}+V_{OFFSET}$, where $V_{OFFSET}$ is the DC voltage level difference between predetermined threshold voltage $V_{REF1}$ and common mode voltage $V_{CM}$, although other values may be used. A programmable predetermined threshold voltage $V_{REF1}$ accommodates variations due to mismatch of measurement circuit 416 and comparator 418 from part-to-part.

During a common-mode-transient event, a common mode transient step is applied between integrated circuit die 106 and integrated circuit die 108. Mismatch in the isolation channel (e.g., bond wire mismatch or isolation capacitor mismatch) converts the common mode transient step energy into a differential error at the input of receiver signal path 202. That differential error can cause errors at the output of the receiver and degrade performance of the isolator product. Since the common mode signal is large, even small mismatch errors (e.g., errors of less than 3%) can substantially degrade CMTI performance of isolator 104. In at least one embodiment of the isolator product, process variation and mismatch of circuit elements introduced during fabrication can substantially shift a transfer function of the communications channel from the target transfer function. A shift of a frequency at which the peak at which maximum gain occurs requires operating the system at a different carrier frequency $f_c$ to obtain the same performance as in other configurations of front-end circuit 402.

Figure 7:
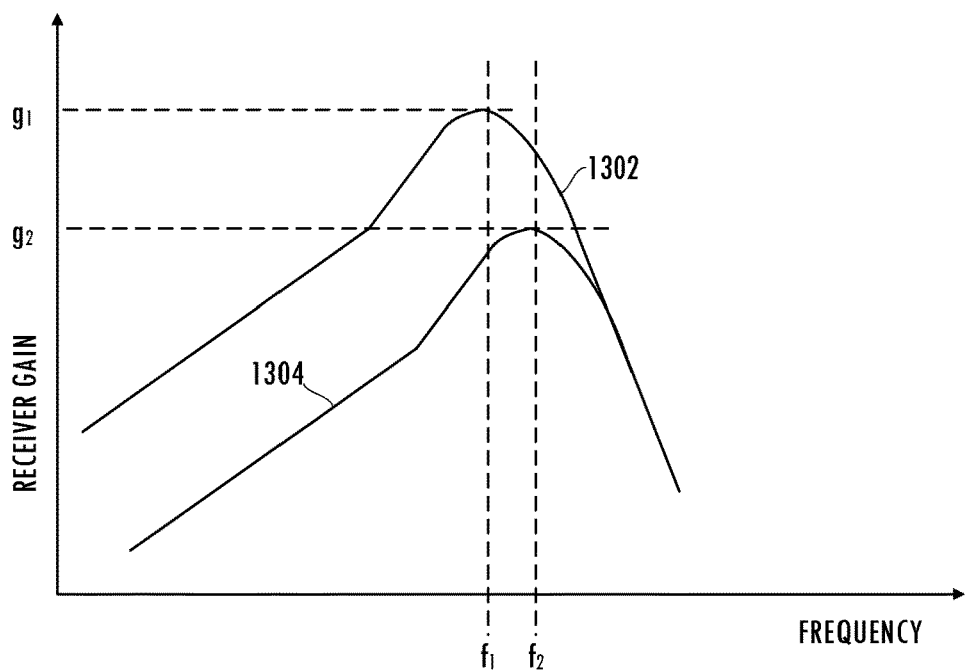
FIG. 7 illustrates exemplary waveforms for receiver gain as a function of frequency for the exemplary isolation channel of FIG. 5 associated with peaking frequency calibration, consistent with at least one embodiment of the invention.
Figure 8:
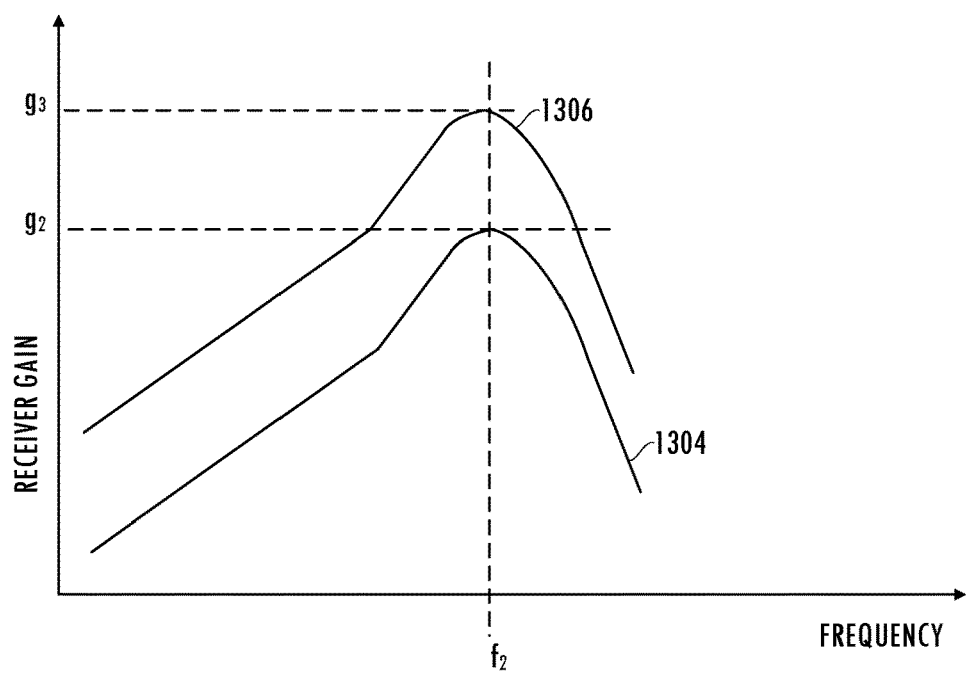
FIG. 8 illustrates exemplary waveforms for receiver gain as a function of frequency for the exemplary isolation channel of FIG. 5 associated with peaking frequency calibration and gain calibration, consistent with at least one embodiment of the invention.

In at least one embodiment, isolator 104 includes a diagnostic mode of operation that measures and calibrates for mismatch in the isolation channel in the diagnostic mode of operation. In at least one embodiment, isolator 104 includes a diagnostic mode of operation that calibrates the transfer function (e.g., the peak and gain) of the isolation channel. However, the gain of the receiver signal path 202 and the peak frequency of the passband of the receiver signal path 202 are non-orthogonal. That is, adjustments to the receiver signal path 202 (e.g., adjustments to front-end circuit 402) that compensate for the actual peak frequency being different from a target peak frequency (e.g., a carrier frequency used in the normal mode of operation) cause corresponding adjustments to the gain of receiver signal path 202. For example, referring to FIGS. 7 and 8, if calibration configures receiver signal path 202 to shift frequency response 1302, with peak frequency f1 and gain g1, to frequency response 1304 having target peak frequency f2, the reduction in capacitance that increases the peak frequency from frequency f1 to frequency f2 lowers the gain at the target peak frequency and at frequencies below the target peak frequency, e.g., resulting in frequency response 1304 having target peak frequency f2 and gain g2. Accordingly, the diagnostic mode of operation identifies the mismatch in the receiver signal path that causes a shift in the carrier frequency and configures the receiver signal path to compensate for that shift and then measures the received signal to calibrate the gain of the receiver signal path. Another adjustment to the receiver signal path (e.g., an adjustment to programmable flat gain stage 610 of peaking gain stage 604) trims the gain of frequency response 1304 to obtain frequency response 1306 having a peak frequency of the target peak frequency $f_c$, as illustrated in FIG. 8. Accordingly, after compensating for the frequency shift, a gain trim configuration is determined to adjust the gain to the target level.

Figure 9:
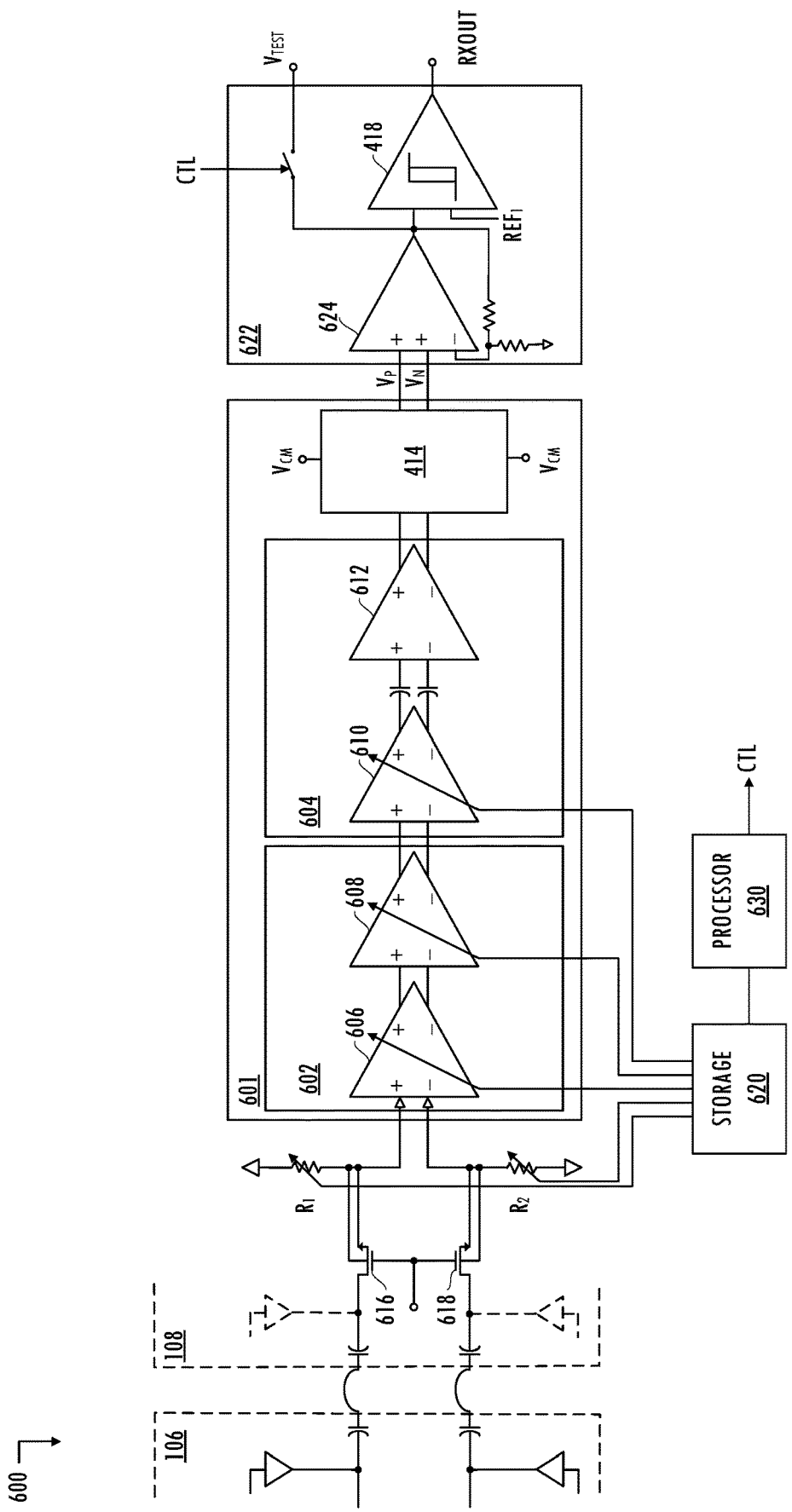
FIG. 9 illustrates a circuit diagram of a portion of the exemplary receiver signal path configured for measurement and calibration consistent with at least one embodiment of the invention.

FIG. 9 illustrates portions of integrated circuit die 108 including features for performing diagnostics and calibration of programmable receiver signal path 601 to compensate for mismatch of the isolation channel or mismatch of the receiver signal path. In at least one embodiment, control signal CTL enables the diagnostic mode of at least one element of programmable receiver signal path 601. In at least one embodiment, control signal CTL enables the output of measurement circuit 624 to be provided to processor 630 or provided externally from integrated circuit die 108 for use in determining a calibrated configuration of programmable receiver signal path 601. In at least one embodiment, of isolator product 600, calibrated configurations determined during the diagnostic mode are received from processor 630 or from off-chip and are stored in integrated circuit die 108. Storage 620 (e.g., one-time-programmable memory or other programmable memory) provides the calibration configuration to corresponding programmable elements of programmable receiver signal path 601, thereby calibrating programmable receiver signal path 601 for normal operation based on information generated in the diagnostic mode of operation. In at least one embodiment, resistor $R_1$, resistor $R_2$, peaking gain stage 606, peaking gain stage 608, and programmable flat gain stage 610 are selectively programmed in the diagnostic mode of operation. Measurement circuit 624 provides signals that are used to determine the calibration configuration of isolator product 600 stored in storage 620.

Figure 10:
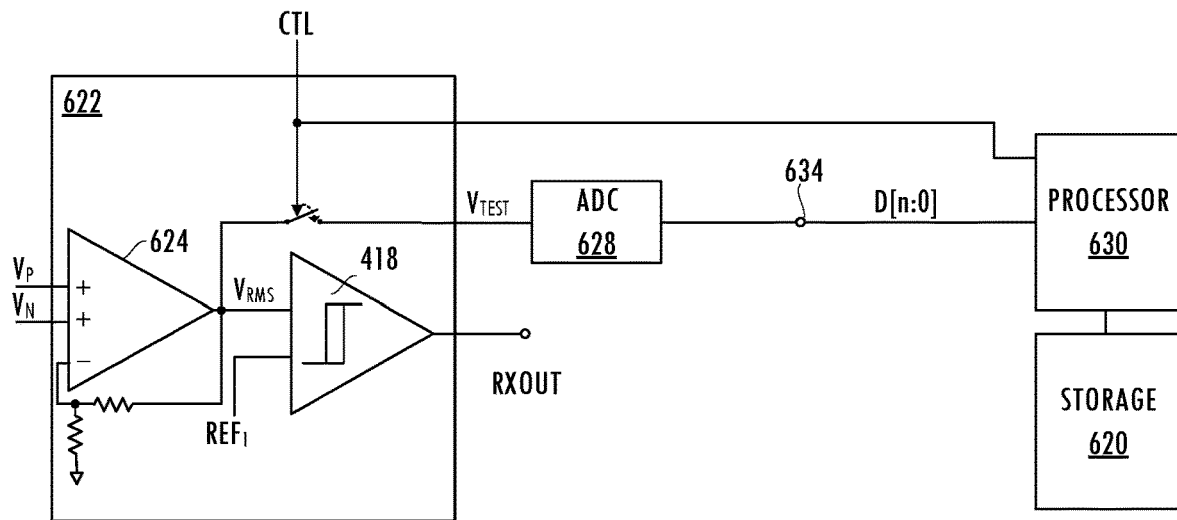
FIG. 10 illustrates a circuit diagram of a demodulator and diagnostic circuit of the exemplary receiver signal path configured for measurement and calibration consistent with at least one embodiment of the invention.

Referring to FIG. 10, in at least one embodiment of integrated circuit die 108, in a diagnostic mode of operation, control signal CTL causes the output of measurement circuit 624 to be provided to analog-to-digital converter 628, which converts the output of measurement circuit 624 (e.g., an RMS voltage signal, measurement $V_{RMS}$) to digital code D[n:0] that is used by processor 630 to determine configuration values for programmable elements of programmable receiver signal path 601 that compensate for mismatch of the isolation channel or for mismatch of elements of programmable receiver signal path 601. Processor 630 writes those configuration values to storage 620 for use in the normal mode of operation, thereby calibrating programmable receiver signal path 601. Although in at least one embodiment measurement circuit 624 provides the RMS voltage of the signal on differential pair of nodes $V_P$ and $V_N$, in other embodiments, measurement circuit 624 uses other measurement techniques to provide a corresponding measurement of the signal on differential pair of nodes $V_P$ and $V_N$. Although comparator 418 compares measurement $V_{RMS}$ to reference voltage level $V_{REF1}$ to generate output RXOUT, which is used by integrated circuit die 108 in the normal mode of operation, in at least one embodiment of the diagnostic mode of operation, output RXOUT is unused in the diagnostic mode of operation. In at least one embodiment, node 634 is a terminal of integrated circuit die 108 and processor 630 is external to integrated circuit die 108.

Figure 11:
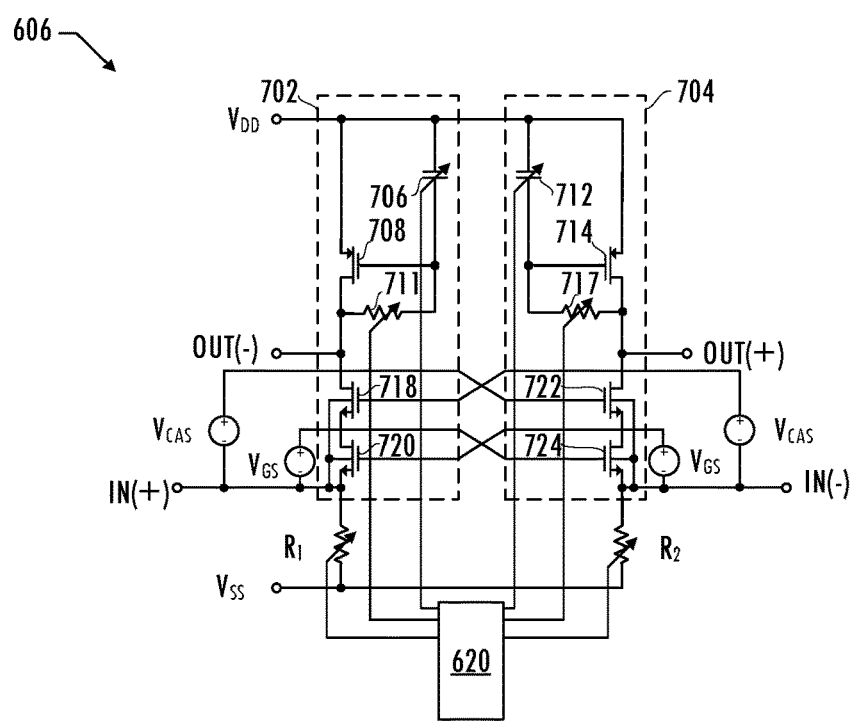
FIG. 11 illustrates a circuit diagram of an exemplary first peaking gain stage of the receiver signal path of FIG. 9 consistent with at least one embodiment of the invention.

FIG. 11 illustrates a circuit diagram of an exemplary implementation of programmable resistor $R_1$ and resistor $R_2$ and a programmable first peaking gain stage. Peaking gain stage 606 is not fully differential and thus, does not include a virtual ground node. Instead, peaking gain stage 606 includes single-ended common gate amplifier 702 and single-ended common gate amplifier 704. Independent sources generate voltage $V_{CAS}$ and voltage $V_{GS}$. Cross-coupling of transistors 722 and 724 to transistors 718 and 720 improves gain since each signal of differential pair of signals IN(+) and IN(−) is added to voltage $V_{GS}$ and voltage $V_{CAS}$ and provided to the other circuit. Resistor 711, capacitor 706, and transistor 708 of single-ended common gate amplifier 702 and resistor 717, capacitor 712, and transistor 714 of single-ended common gate amplifier 704, form frequency-shaping active loads that cause peaking gain stage 700 to have a peak gain at a frequency at or near carrier frequency $f_c$. The frequency-shaping active loads improve common-mode transient immunity since the gain at carrier frequency $f_c$ is higher than the gain at frequencies that predominate common mode transient events. In at least one embodiment, resistor 711 and resistor 717 are variable resistors that can be programmed with different values in the diagnostic mode of operation and are configured according to predetermined values stored in storage 620 during a normal mode of operation. In other embodiments, capacitor 706 and capacitor 712 are programmable. In other embodiments, transistor 708, transistor 714, capacitor 706, and capacitor 712 are omitted and the load provides a low-pass transfer function. Although peaking gain stage 606 provides some common-mode rejection, mismatched devices in peaking gain stage 606 can cause common-mode-to-differential conversion of any common-mode transient signals, which degrades the output signals on output differential pair of nodes OUT(+) and OUT(−).

Figure 12:
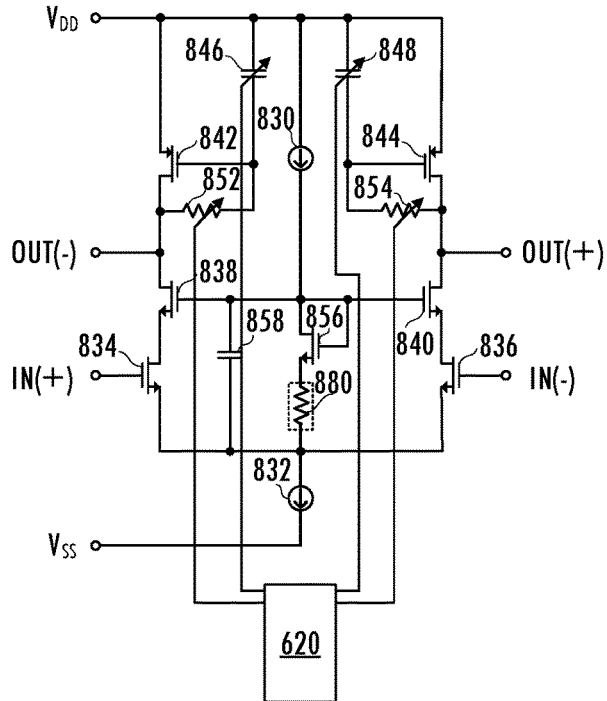
FIG. 12 illustrates a circuit diagram of an exemplary second peaking gain stage of the receiver signal path of FIG. 9 consistent with at least one embodiment of the invention.

FIG. 12 illustrates a circuit diagram of a programmable second peaking gain stage that is cascaded with the first peaking gain stage. Peaking gain stage 608 includes capacitor 846, transistor 842, resistor 852, capacitor 848, transistor 844, and resistor 854, that form frequency-shaping active loads coupled to a differential pair of transistors that causes the second peaking gain stage 608 to have a peak gain at a frequency at or near carrier frequency $f_c$. The frequency response of peaking gain stage 608 has an increased gain around a narrow frequency band before a cutoff frequency of the frequency response, creating a bandpass-like effect having the highest gain at or near carrier frequency $f_c$. The frequency-shaping active loads improve common-mode transient immunity as compared to conventional diode-connected active loads since the gain at the carrier frequency is higher than the gain of frequencies that predominate common mode transient events. Transistors 834 and 836 form a differential pair of transistors that convert voltage into current driving the frequency-shaping active loads. In at least one embodiment, resistor 852 and resistor 854 are variable resistors that can be programmed with different values in a diagnostic mode of operation and are configured according to predetermined values stored in storage 620 during a normal mode of operation. However, in other embodiments, capacitor 846 and capacitor 848 are variable and can be programmed with different values in a diagnostic mode of operation and are configured according to predetermined values stored in storage 620 during a normal mode of operation. In other embodiments, transistor 842, transistor 844, capacitor 846, and capacitor 848 are omitted and the load provides a low-pass transfer function.

Current 830 is a portion of current 832 that passes through resistance 880 and self-biased diode-connected transistor 856 and configures transistors 838 and 840 as a telescopic pair of cascode transistors. In at least one embodiment, current 830 is selectively configurable according to a control signal and resistance 880 has the selectively configurable implementation. However, in other embodiments, current 830 and resistance 880 are fixed. In at least one embodiment, a selectively configurable tail current source that supports quiescent current programmability generates current 832. Transistors 834 and 836 and transistors 838 and 840 are configured as a telescopic differential circuit. Resistance 880 creates a bias voltage drop and sets a minimum guaranteed value of the drain-to-source voltage for transistors 834 and 836, which are configured as a differential pair of transistors. Transistors 838 and 840 are configured as cascode transistors that reduce or eliminate any frequency-dependent loading effects created by this circuit from affecting peaking gain stage 606, which is coupled to the gate nodes of transistors 834 and 836. Capacitor 858 maintains a suitable self-biased operating point for the cascode transistors during common mode transient events.

Figure 13:
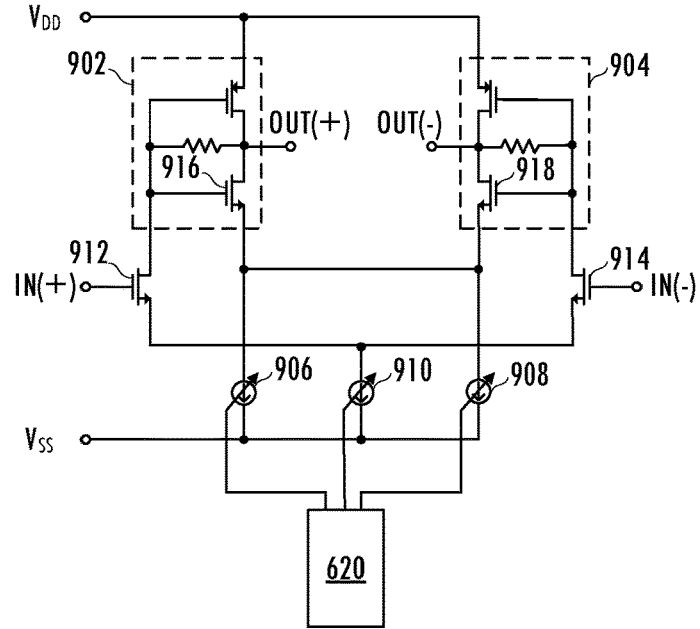
FIG. 13 illustrates a circuit diagram of an exemplary programmable flat gain stage of the receiver signal path of FIG. 9 consistent with at least one embodiment of the invention.

Referring to FIGS. 9 and 13, in at least one embodiment, peaking gain stage 608 directly drives (i.e., without buffering) variable peaking gain stage 604, which has a programmable variable gain. Variable peaking gain stage 604 further amplifies the received signal and provides a robust mechanism for adjusting the gain of programmable receiver signal path 601 to address gain variations (e.g., variations due to mismatched bond wires, mismatched isolation capacitors, or mismatch in the receiver signal path). Variable peaking gain stage 604 includes programmable flat gain stage 610 with a frequency response having a flat pass band (i.e., a gain that has negligible variation with respect to frequency) that drives peaking gain stage 612.

In at least one embodiment, programmable flat gain stage 610 includes an inverter-like active load 902 and 904 that is capable of directly driving a downstream peaking gain stage. Selectable values of currents 906, 908, and 910 provide programmability of the flat gain value, which allows for compensation for variations in the receiver signal path or the isolation channel that affect the gain of the receiver signal path. In at least one embodiment, currents 906, 908, and 910 are provided by variable current sources that can be programmed with different values that are determined in the diagnostic mode of operation and are configured according to predetermined values stored in storage 620 during the normal mode of operation. In at least one embodiment, programmable flat gain stage 610 includes transistors 912 and 914 configured as an outer differential pair of transistors and transistors 916 and 918 configured as an inner differential pair of transistors. The outer differential pair of transistors is coupled to a tail current source that provides an integer multiple of a unit current (i.e., $I_{910}=n \times I_{LSB}$) and the inner differential pair of transistors is coupled to another tail current source that provides (or corresponding tail current sources that jointly provide) a larger integer multiple of the unit current (e.g., $I_{906}+I_{908}=((n+2) \times I_{LSB})$). Programmable peaking gain stage 610 provides a differential output signal that is received by peaking gain stage 612. In at least one embodiment, programmable flat gain stage 610 directly drives (i.e., without buffering) peaking gain stage 612 to form a programmable peaking gain stage.

Figure 14:
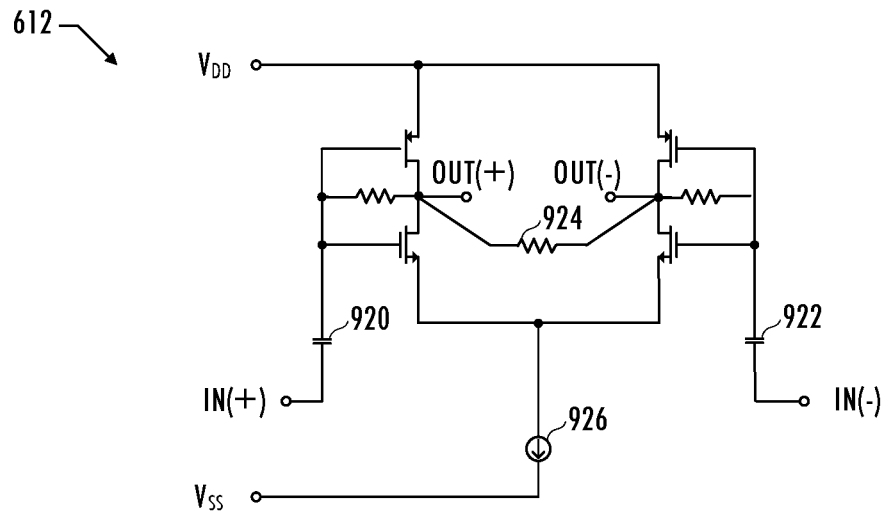
FIG. 14 illustrates a circuit diagram of an exemplary peaking gain stage of the receiver signal path of FIG. 9 consistent with at least one embodiment of the invention.

Referring to FIGS. 9 and 14, in an embodiment, unlike peaking gain stages 606 and 608 described above, peaking gain stage 612 is an AC-coupled, common-source amplifier. Capacitors 920 and 922 block DC offsets from all prior stages of programmable receiver signal path 601 and the isolation channel. Resistor 924 reduces DC gain and linearizes the gain stage response, but also reduces the overall gain. Therefore, in at least one embodiment of peaking gain stage 612, resistor 924 is omitted. Peaking gain stage 612 has a frequency response similar to peaking gain stages 606 and 608, providing a band-pass filter-like response centered at or near carrier frequency $f_c$. Peaking gain stage 612 generates a quiescent current that is programmable via current source 926, which is coupled to a tail node of the common-source amplifier. Peaking gain stage 612 in combination with programmable flat gain stage 610 has gain with dynamic range that is sufficient to offset the loss of gain of peaking gains stages 608 and 610 when configured for compensation of mismatch in the isolation channel. Peaking gain stage 612 directly (i.e., without buffering) drives high-pass filter 414.

Referring to FIG. 9, in at least one embodiment, the selectable gain of variable peaking gain stage 604 is configured to compensate for manufacturing variations (e.g., slightly increased or decreased isolation capacitor values) or gain error induced by peak calibration, as discussed further below. In at least one embodiment, the selectable gain of front-end circuit 602 is configured to compensate for manufacturing variations (e.g., slightly increased or decreased isolation capacitor values) or gain error induced by peak calibration, as discussed further below. In at least one embodiment, suitable configurations values are predetermined using automatic test equipment during production test and stored in storage 620.

Figure 15:
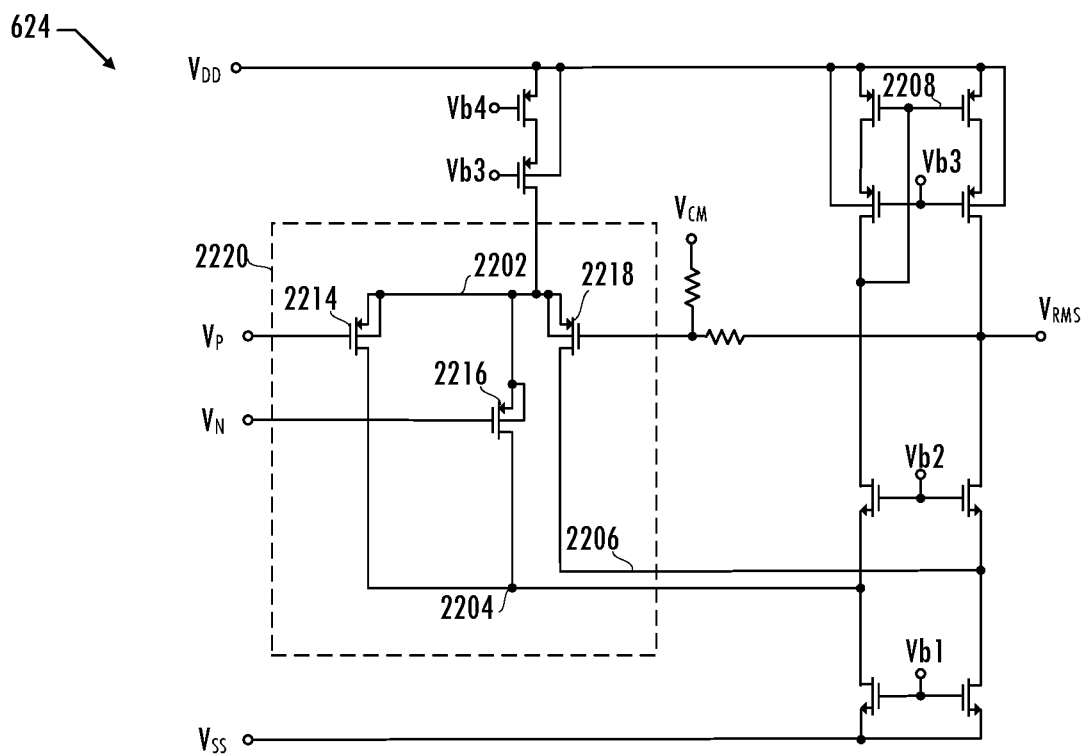
FIG. 15 illustrates a circuit diagram of an exemplary root mean square detector of the receiver signal path of FIG. 9 consistent with at least one embodiment of the invention.

In normal operation, demodulator/detector 622 removes the carrier from received differential pair of signals $V_P$ and $V_N$ and compares the demodulated signal to a reference signal and generates a logic '0' signal or a logic '1' signal based on the comparison. In at least one embodiment, demodulator/detector 622 detects the lesser signal of the differential pair of signals $V_P$ and $V_N$. In at least one embodiment, measurement circuit 624 includes a minimum selector (or a maximum selector) that identifies which signal has the minimum (or the maximum, as the case may be) of greater magnitude. Referring to FIGS. 9 and 15, the output of measurement circuit 624 is an equivalent average value of the identified signal (e.g., an analog signal that has a linear relationship to a root mean square proportional function of the full-wave rectified version of the received differential pair of signals $V_P$ and $V_N$). That equivalent average value is much greater than a magnitude of a common mode voltage $V_{CM}$. Comparator 418 compares that equivalent average signal to predetermined threshold voltage $V_{REF1}$, which has a magnitude that is approximately half the target gain amplitude.

FIG. 15 illustrates a circuit diagram of an exemplary measurement circuit of demodulator/detector 622 consistent with at least one embodiment of an isolator product. Measurement circuit 624 includes transistor 2214 and transistor 2216 that are configured as a winner-take-all extremum selector (e.g., a minimum selector). The transistor having the gate terminal that sees the lesser voltage of the differential pair of signals $V_N$ and $V_P$ is the winner, i.e., is configured as an active transistor. The other transistor will be inactive (i.e., off). The minimum selector forms one half of differential circuit 2220. As transistors 2214 and 2216 of differential circuit 2220 take turns selecting the minimum of the voltage levels of differential pair of signals $V_N$ and $V_P$, the effect on the output current of those transistors can be represented by the equivalent average signal that, if applied to an equivalent combined device forming half of the differential stage equal in size to transistor 2218, generates the same current through node 2204 at the drains of transistors 2214 and 2216.

In at least one embodiment, differential circuit 2220 has three transistor branches coupled to node 2202, with two of the three transistor branches configured as the minimum selector. Transistor 2218 forms the other half of differential circuit 2220 and has a size that is equal to a combination of the sizes of transistors 2214 and 2216. Transistor 2218 receives a feedback voltage and generates a corresponding feedback current. The output current at node 2204 has the carrier signal removed and is representative of the minimum signal of differential pair of signals $V_P$ and $V_N$. Current through node 2204 and the reference current through node 2206 enter into a folded cascode circuit. The greater of those two currents will determine the value of measurement $V_{RMS}$. The feedback loop attempts to match the current through node 2206 to the current through node 2204, thereby adjusting measurement $V_{RMS}$. Either the feedback current or the current that represents the minimum signal of differential pair of signals $V_P$ and $V_N$ determines measurement $V_{RMS}$. For example, in normal operation, if a received on-off keying modulated signal is 'ON' (i.e., the carrier signal is present), and the feedback voltage is properly attenuated, then the current through node 2204 is greater than the current through node 2206, thereby determining measurement $V_{RMS}$. If the on-off keying modulated signal is 'OFF' (i.e., the carrier signal is not present), then the feedback current through node 2206 is greater than the current through node 2204 and determines measurement $V_{RMS}$. Thus, the feedback loop causes the current through node 2206 to track the current through node 2204 whether the on-off keying modulated signal is 'ON' or 'OFF.'

A folded cascode circuit provides a differential to single-ended conversion at node 2208 to generate measurement $V_{RMS}$ (e.g., a root mean square signal corresponding to differential pair of signals $V_P$ and $V_N$). A static bias circuit provides bias voltages Vb1, Vb2, Vb3, and Vb4. Bias voltages Vb1 and Vb2 are wide-swing cascode bias voltages for a n-type folded cascode structure, bias voltage Vb3 is a cascode bias voltage for a p-type cascode structure, and bias voltage Vb4 is a simple mirror bias voltage. In normal operation, comparator 418 receives measurement $V_{RMS}$ and generates output RXOUT based thereon. In at least one embodiment of the diagnostic mode, the output of measurement circuit 624 (e.g., measurement $V_{RMS}$) is provided as voltage $V_{TEST}$.

Figure 16:
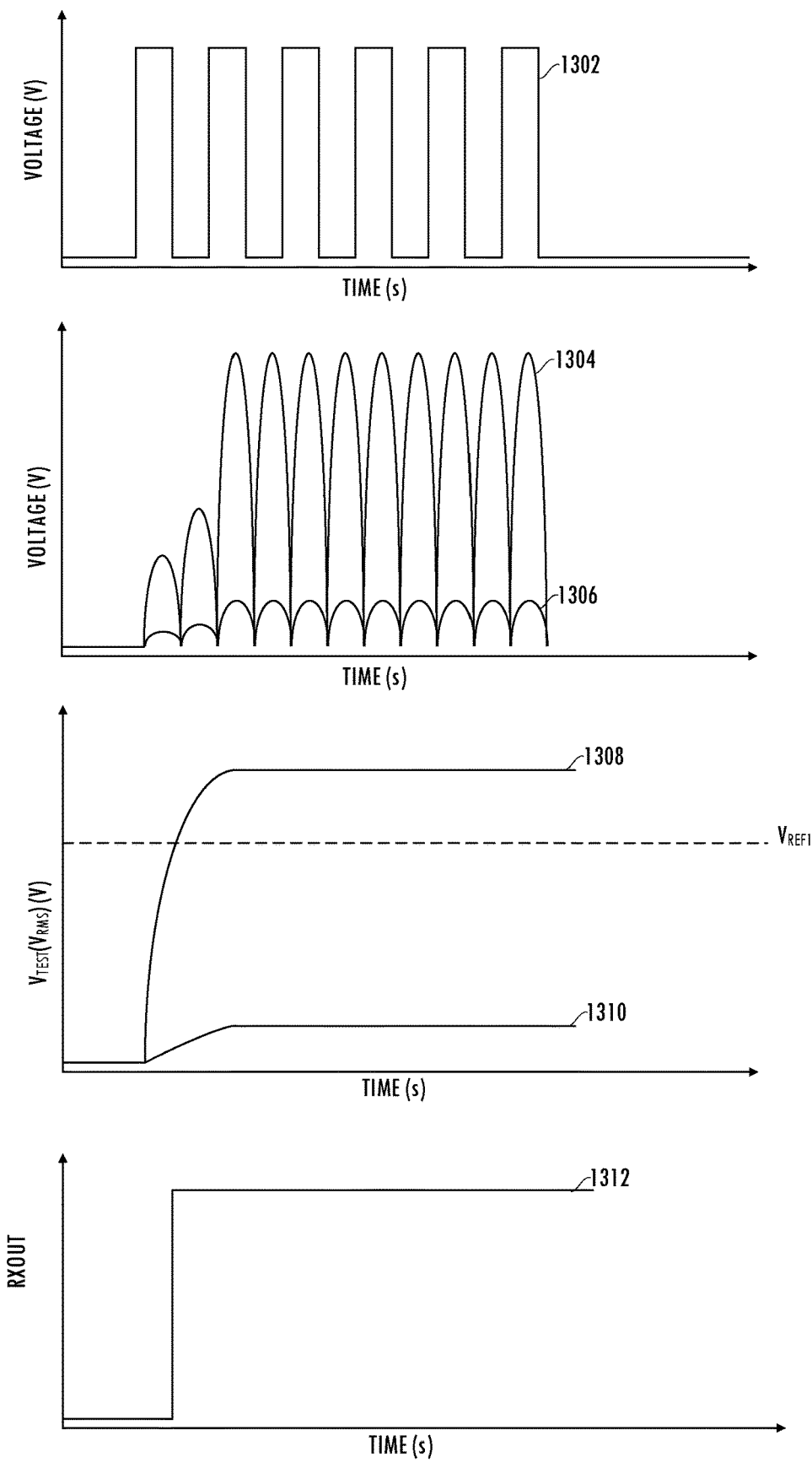
FIG. 16 illustrates exemplary waveforms for voltage as a function of time for signals associated with the measurement circuit of FIG. 15 consistent with at least one embodiment of the invention.

Referring to FIGS. 9 and 16, exemplary signal waveforms for programmable receiver signal path 601 differ for the normal mode of operation and a diagnostic mode of operation. In a normal mode of operation, integrated circuit die 106 transmits data using signal 1302. Signal 1304 is an exemplary rectified version of the received signal and signal 1308 is the corresponding measurement $V_{RMS}$ that results in signal 1312 provided as output RXOUT. Programmable receiver signal path 601 provides a differential signal 1304 at the input of demodulator/detector 622. Measurement circuit 624 outputs root mean square signal 1308 that is compared to predetermined threshold voltage $V_{REF1}$ and converted to output signal 1312 that is provided as output signal RXOUT.

In at least one embodiment, the isolation product is configured in the diagnostic mode of operation for measurement and calibration of mismatch of the isolation channel (e.g., bond wire mismatch or mismatch of isolation capacitors). The technique measures the mismatch and adjusts the receiver signal path until voltage $V_{TEST}$ is at or near zero Volts, thereby improving the CMTI performance of the isolator product. Integrated circuit die 106 is configured to transmit a common mode test signal $F_{TEST}$, that has a frequency that matches the frequency of the OOK clock. Isolator product 600 applies the common mode test signal between the isolated grounds of integrated circuit die 106 and integrated circuit die 108. If the isolation channel is perfectly matched, then programmable receiver signal path 601 does not receive a differential signal and measurement $V_{RMS}$ is zero or a negligible signal. However, if the isolation channel is mismatched, a non-zero signal is present at the input of measurement circuit 624 and corresponds to rectified signal 1306 and measurement 1310. Measurement circuit 624 provides signal $V_{TEST}$ that has a level linearly related to the root mean square value of the differential input to measurement circuit 624. If the output of measurement circuit 624 is greater than a threshold level (e.g., signal 1308), then a production test may reject the isolator product. However, if the output of RMS detector, measurement $V_{RMS}$, is below the threshold level (e.g., predetermined threshold voltage $V_{REF1}$), then a production test calibrates the receiver signal path to compensate for the isolation channel mismatch. For example, at least one programmable element of peaking gain stages 606 and 608 is configured to reduce or eliminate any effects from the isolation channel mismatch. In at least one embodiment, a digital code corresponding to the measured level (e.g., RMS level) is written to storage 620 during production test.

In at least one embodiment, the diagnostic mode of operation measures differential error due to mismatch based on a clock test signal transmitted between the grounds at the carrier frequency and calibrates the isolator product to improve CMTI. The demodulator/detector first measures the received signal and provides a digital code corresponding to the measured value (e.g., a digital code corresponding to a RMS voltage of the received signal). The diagnostic mode of operation allows the isolator product to use single digit voltages to measure the mismatch in the isolation channel and perform calibration during production test. The diagnostic mode of operation can also be used to measure a shift of the peak frequency of the receiver pass band or gain of the receiver signal path of the isolator product. A processor determines a programmable receiver signal path configuration that compensates for the mismatch, peak frequency shift, or adjusts the gain of the receiver signal path. Calibration improves the CMTI performance of the isolator product without increasing power consumption or complexity to the architecture of the isolator product.

Figure 17:
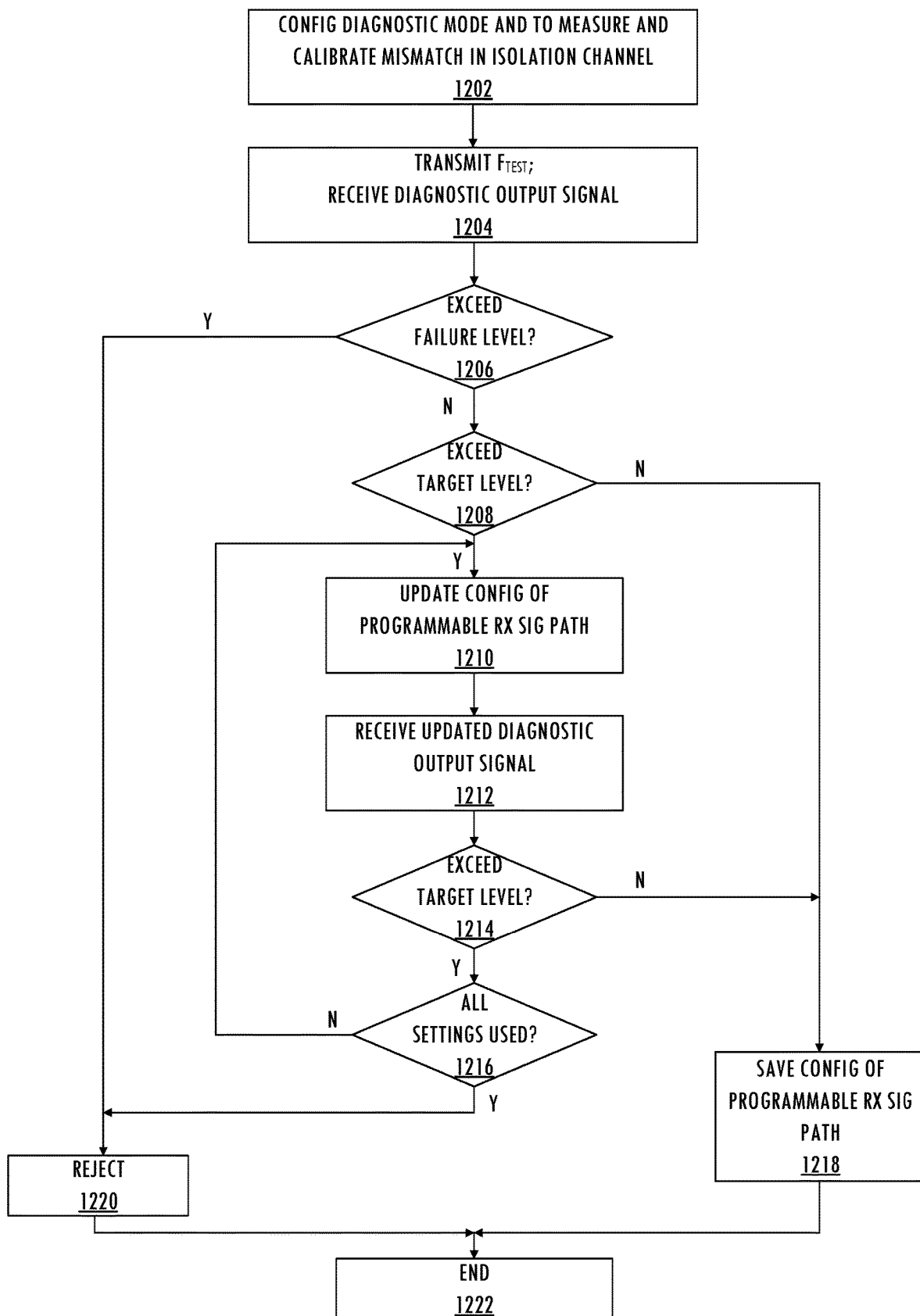
FIG. 17 illustrates exemplary information and control flows for measurement and calibration of mismatch in the isolation channel consistent with at least one embodiment of the invention.

Referring to FIGS. 9, 10, and 17, in at least one embodiment, isolator product 600 is configured in a diagnostic mode of operation and isolator product 600 is configured to measure and compensate for mismatch of the isolation channel (1202). Integrated circuit die 106 is configured to transmit a common mode test signal $F_{TEST}$ that has a frequency that is the same as the frequency (e.g., 500 MHz) of a carrier signal used in the normal mode of operation to transmit data between integrated circuit die 106 and integrated circuit die 108 using the isolation channel of isolator product 600. Processor 630 generates control signal CTL to enable the path for providing measurement $V_{RMS}$ from measurement circuit 624 as signal $V_{TEST}$ received by analog-to-digital converter 628. In the diagnostic mode, integrated circuit die 106 transmits common mode test signal $F_{TEST}$ and processor 630 receives a corresponding diagnostic output signal. For example, processor 630 receives digital code D[n:0], which is a digitized version of the measurement $V_{RMS}$ (1204). In at least one embodiment of the isolator product, measurement $V_{RMS}$ is an analog signal that has a linear relationship to a root mean square proportional function of the full-wave rectified version of the received differential pair of signals $V_P$ and $V_N$. Therefore, the resolution of the diagnostic signal received by processor 630 is limited only by the resolution of analog-to-digital converter 628 (e.g., the number of bits of digital code D[n:0]). In at least one embodiment, processor 630 compares digital code D[n:0] to a predetermined failure threshold level. If digital code D[n:0] exceeds the predetermined failure threshold level (1206), then the mismatch of the isolation channel is fatal and processor 630 indicates that the device under test should be rejected (1220) and ends measurement and calibration of the device under test (1222). If digital code D[n:0] does not exceed the predetermined failure threshold level (1206), then measurement and calibration continues since the mismatch of the isolation channel is within target specifications.

In at least one embodiment, processor 630 implements an iterative calibration and compares the digital code D[n:0] to a target level of mismatch that is less than the predetermined failure threshold level an acceptable threshold level of mismatch. If digital code D[n:0] does not exceed the target level of mismatch, which corresponds to an acceptable threshold level of mismatch (1208), then processor 630 does not update any settings of programmable receiver signal path 601 and processor 630 stores the current configuration (which may be default settings of programmable receiver signal path 601) in storage 620 (1218) and ends calibration (1222). If digital code D[n:0] exceeds the target level of mismatch (1208), then processor 630 updates configuration settings of the programmable receiver signal path 601 with one or more settings that increase compensation for mismatch of the isolation channel corresponding to digital code D[n:0] (1210). After updating the configuration settings, processor 630 receives an updated version of digital code D[n:0] (1212) and compares the updated digital code D[n:0] to the target level (1214) and continues calibration if digital code D[n:0] exceeds the target level of mismatch and all settings have not been used (1216). If no untested settings remain, then the device under test is rejected (1220) and calibration ends (1222). In at least one embodiment, processor 630 stores the configuration in storage 620 (1218) and ends calibration (1222). In at least one embodiment, all settings are tested. In other embodiments, only a predetermined subset of settings are tested. Note that the information and control flow of FIG. 17 is exemplary only and other information and control flows that measure and calibrate of mismatch of the isolation channel may be used. In other embodiments, processor 630 sweeps through all of the configurations of the receiver signal path and selects the configuration that results in an amplitude of digital code D[n:0] that is closest to zero, which corresponds to the minimum effect of the mismatch. Processor 630 stores that configuration in storage 620. If all of the configurations correspond to values of digital code D[n:0] that exceed the predetermined failure threshold level), then the mismatch of the isolation channel is fatal and processor 630 indicates that the device under test should be rejected.

Figure 18:
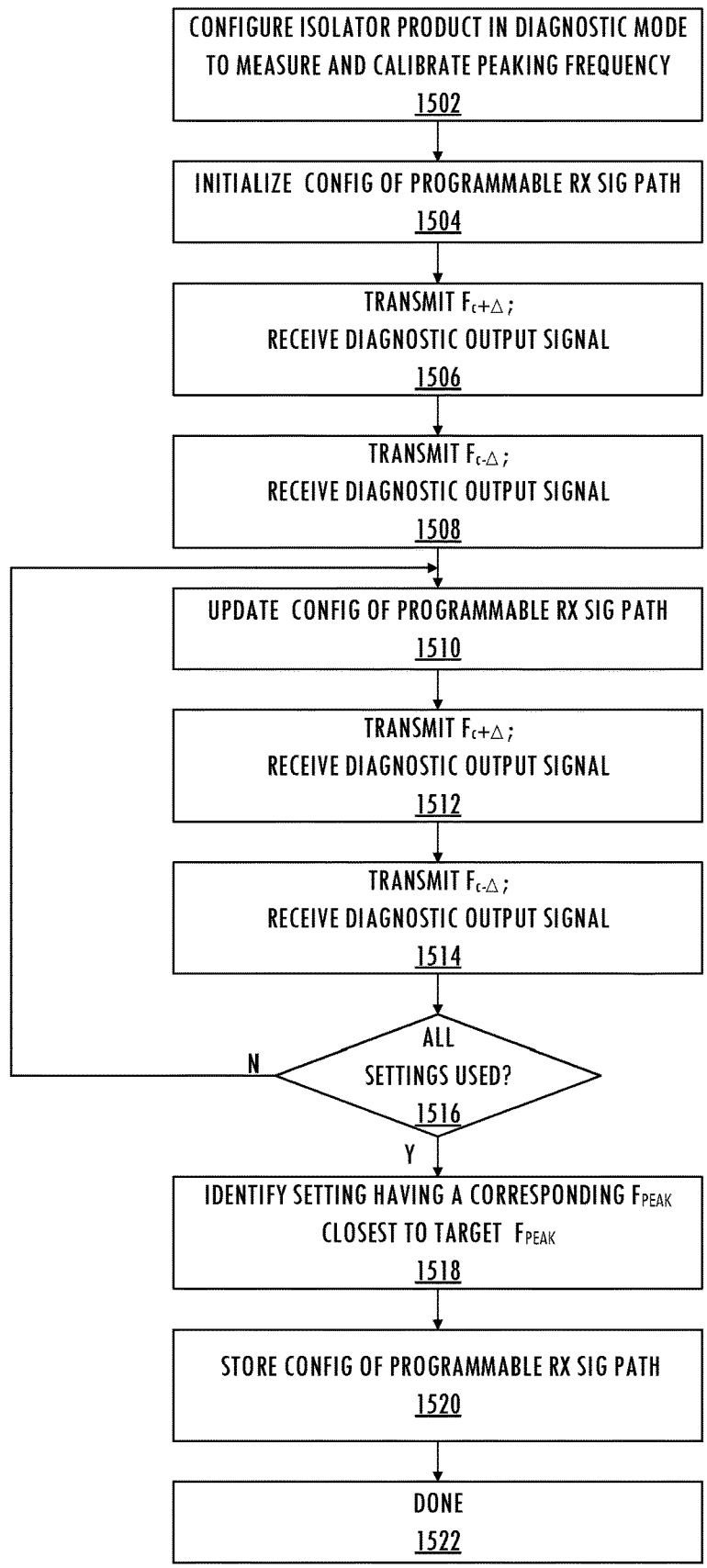
FIG. 18 illustrates exemplary information and control flows for measurement and calibration of the peaking frequency of the isolation channel consistent with at least one embodiment of the invention.

Referring to FIGS. 9, 10, and 18, in at least one embodiment of the diagnostic mode of operation, integrated circuit die 106 is configured to generate two test signals that are transmitted during different intervals. The test signals have frequencies that are straddled about the target carrier frequency used to communicate data in the normal mode of operation. Processor 630 measures corresponding received signals and uses those measurements to calibrate the isolator product to center the communications channel transfer function about the target carrier frequency and to have a target gain, as discussed further below. In an exemplary embodiment, the target carrier frequency is frequency $F_C$ $\Delta$ is a predetermined frequency offset, and frequencies $F_{C+\Delta}$ and $F_{C-\Delta}$ straddle carrier frequency $F_C$, i.e., are higher and lower than carrier frequency $F_C$, respectively, e.g., are centered about carrier frequency $F_C$. For example, the target carrier frequency is 500 MHz and the test signals include a 450 MHz test signal and a 550 MHz test signal. Measured values corresponding to programmable settings are used to identify the programmable setting that has the smallest error between the measured RMS value of the two test signals. The receiver signal path is configured with the identified setting.

For example, isolator product 600 is configured in the diagnostic mode of operation to measure and calibrate the peaking frequency of programmable receiver signal path 601 (1502) and initializes a configuration of programmable receiver signal path 601 (1504). Processor 630 configures integrated circuit die 106 to transmit a first test signal having frequency $F_{C+\Delta}$. Processor 630 generates control signal CTL to enable the path for providing the output of measurement circuit 624 as signal $V_{TEST}$ received by analog-to-digital converter 628. Integrated circuit die 106 transmits test signal $F_{C+\Delta}$ during a first interval and processor 630 receives and stores digital code D[n:0], which is a digitized version of measurement $V_{RMS}$ provided as the corresponding output diagnostic signal (1506). Integrated circuit die 106 transmits test signal $F_{C-\Delta}$ during a second interval and processor 630 receives and stores a corresponding value of the output diagnostic signal (e.g., digital code D[n:0], which is a digitized version of measurement $V_{RMS}$) (1508). The first interval and the second interval are non-overlapping intervals. Processor 630 updates the configuration of the programmable receiver signal path (e.g., programmable load of peaking gain stage 606, programmable load of peaking gain stage 608, or other programmable element of programmable receiver signal path 601) to a next setting (1510).

For each setting, integrated circuit die 106 transmits test signal $F_{C+\Delta}$ during a first interval, processor 630 receives and stores a corresponding digital code D[n:0](1512), integrated circuit die 106 transmits test signal $F_{C-\Delta}$ during a second interval, and processor 630 receives and stores a corresponding updated value of digital code D[n:0] (1514). If all of the settings of the receiver signal path have been tested (1516), processor 630 uses the values of digital code D[n:0] corresponding to the first and second intervals for each setting to identify a setting of programmable receiver signal path that has a corresponding peak frequency closest to the target peak frequency (i.e., has the smallest error between measurement $V_{RMS}$ in the first interval and measurement $V_{RMS}$ in the second interval) (1518). Processor 630 processes the stored values to identify the setting with the smallest error between D[n:0] corresponding to test signal having frequency $F_{C+\Delta}$ and D[n:0] corresponding to test signal having frequency $F_{C-\Delta}$. Processor 630 saves the identified setting for the programmable receiver signal path in storage 620 for use during normal mode of operation or other measurement and calibration techniques (1520) and the diagnostic technique ends (1522). In other embodiments, processor 630 does not store all values of D[n:0]. Instead, processor 630 compares a current error value to a prior error value and saves the settings and corresponding error value associated with the smallest error. Note that the information and control flow of FIG. 18 is exemplary only and other information and control flows that measure and calibrate of mismatch of the isolation channel may be used.

Figure 19:
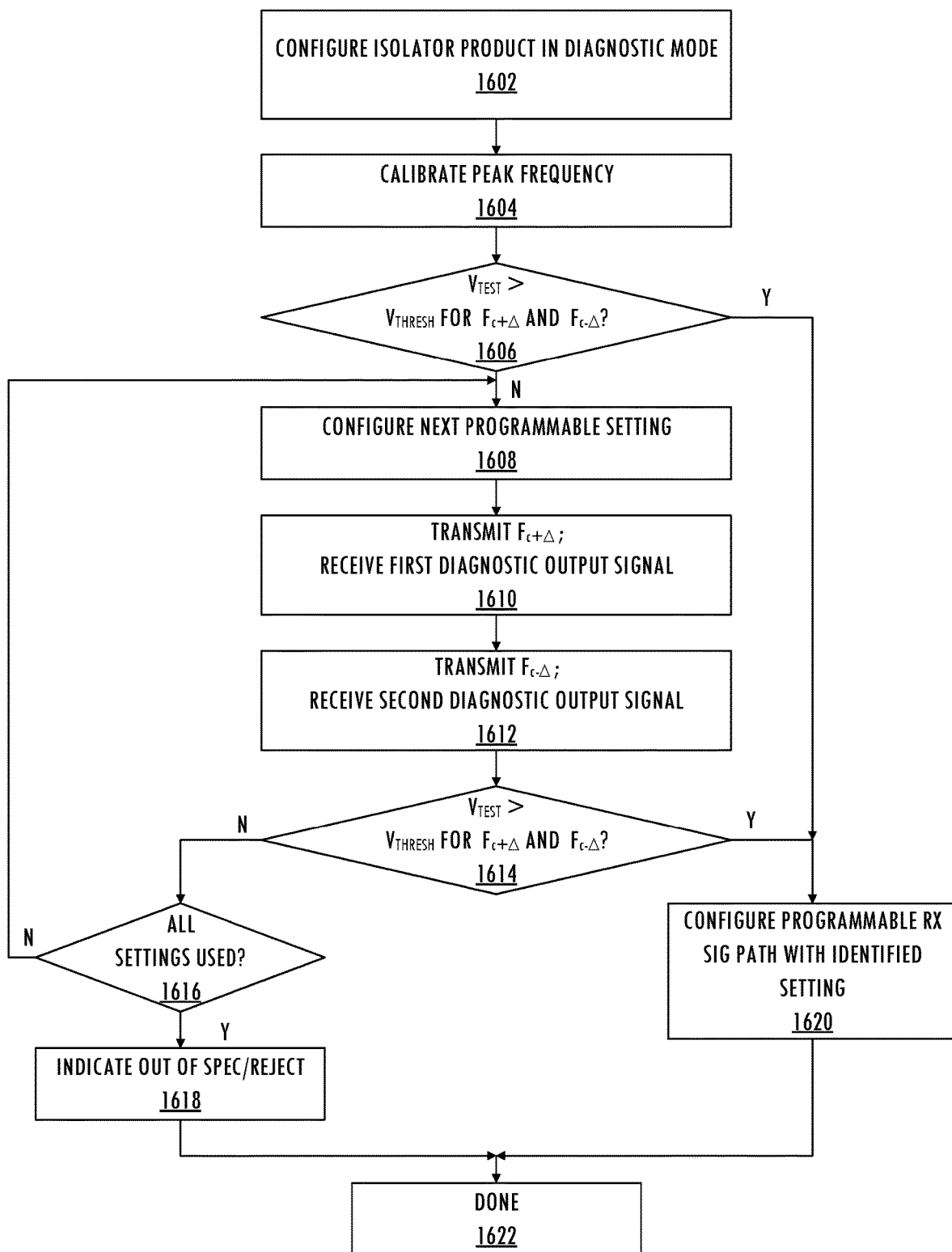
FIG. 19 illustrates exemplary information and control flows for measurement and calibration of the gain of the isolation channel consistent with at least one embodiment of the invention.

Referring to FIGS. 9, 10, and 19, in at least one embodiment of a diagnostic mode of operation, a gain code that results in a measurement signal $V_{TEST}$ that is greater than a threshold voltage level (e.g., 500 mV or other threshold voltage level determined based on noise margins for CMT and reference voltage) for each of the test signals is selected for configuration of receiver signal path. For example, processor 630 compares a digitized version of measurement signal $V_{TEST}$ corresponding to the test signal having frequency $F_{C+\Delta}$ to a threshold voltage and compares a digitized version of measurement signal $V_{TEST}$ corresponding to the test signal having frequency $F_{C-\Delta}$ to the threshold voltage. If both measurements exceed the threshold voltage level, then the gain code is stored for later use in normal mode of operation.

In at least one embodiment, processor 630 configures isolator product 600 in the diagnostic mode (1602) and calibrates the peak frequency of the programmable receiver signal path, as described above or using other suitable technique (1604). In at least one embodiment, the technique described above is used for calibration of the peak frequency and values of measurement $V_{TEST}$ for each interval corresponding to the test signal having frequency $F_{C+\Delta}$ and the test signal having frequency $F_{C-\Delta}$ are already stored in storage 620. If both values of digital code D[n:0] exceed threshold voltage $V_{THRESH}$ (1606), then no further gain calibration occurs, and processor 630 configures the programmable receiver signal path with the current configuration of the programmable receiver signal path (e.g., by saving the current configuration in storage 620) (1620), and calibration ends (1622). In at least one embodiment, processor 630 does not start from a minimum gain. If both values of digital code D[n:0] exceed threshold voltage $V_{THRESH}$, processor 630 ensures that the gain configuration is not too high by lowering the gain until one or both of the digital codes D[n:0] falls below threshold voltage $V_{THRESH}$ and then selects the configuration prior to the failure.

If the value of digital code D[n:0] does not exceed threshold voltage $V_{THRESH}$ for both frequencies of the test signal (1606), then processor 630 updates the configuration of programmable receiver signal path 601 with a next setting of programmable receiver signal path 601 (1608). Processor 630 configures integrated circuit die 106 to transmit the test signal having frequency $F_{C+\Delta}$ during a first interval and receives a corresponding value of digital code D[n:0] (1610). Next, processor 630 configures integrated circuit die 106 to transmit the test signal having frequency $F_{C-\Delta}$ during a second interval and receives a corresponding value of digital code D[n:0] (1612). If the value of digital code D[n:0] that corresponds to test signal having frequency $F_{C+\Delta}$ during the first interval and the value of digital code D[n:0] that corresponds to the test signal having frequency $F_{C-\Delta 2}$ during the second interval indicate that measurement signal $V_{TEST}$ exceeds threshold voltage $V_{THRESH}$ during both intervals (1614), then the configuration of programmable receiver signal path 601 performs within a target gain specification and processor 630 configures and stores the configuration of the programmable receiver signal path for later use during normal operation (1620) and gain calibration ends (1622).

If the values of digital code D[n:0] that correspond to the test signal having frequency $F_{C+\Delta}$ during the first interval and the test signal having frequency $F_{C-\Delta}$ during the second interval each have a corresponding measurement signal $V_{TEST}$ that does not exceed threshold voltage $V_{THRESH}$ (1614) and all settings for the programmable receiver signal path 601 have not yet been tested (1616), then processor 630 configures programmable receiver signal path 601 with the next programmable setting (1608). If either of the values of digital code D[n:0] that correspond to the test signal having $F_{C+\Delta}$ during the first interval and the test signal having frequency $F_{C-\Delta}$ during the second interval indicate measurement signal $V_{TEST}$ does not exceed threshold voltage $V_{THRESH}$ (1614) and all settings for the programmable receiver signal path 601 have been tested (1616), then processor 630 indicates that the isolator product is out of specification and unable to be calibrated to be within specification (i.e., indicates rejection of the isolator product, e.g., by providing an error code) (1618) and ends the gain calibration of the isolator product (1622). The information and control flows of FIG. 19 is exemplary only and other sequences and variations of the information and control flows may be made based on the description set forth herein.

Thus, a programmable receiver signal path and techniques for calibrating the programmable receiver signal path to improve CMTI performance of an isolator product and calibrate peaking frequency and gain of the receiver signal path are disclosed. The description of the invention set forth herein is illustrative and is not intended to limit the scope of the invention as set forth in the following claims. Structures described herein may be implemented using software executing on a processor (which includes firmware) or by a combination of software and hardware. Software, as described herein, may be encoded in at least one tangible (i.e., non-transitory) computer readable medium. As referred to herein, a tangible computer-readable medium includes at least a disk, tape, or other magnetic, optical, or electronic storage medium.

The terms "first," "second," "third," and so forth, as used in the claims, unless otherwise clear by context, is to distinguish between different items in the claims and does not otherwise indicate or imply any order in time, location or quality. For example, "a first received network signal," "a second received network signal," does not indicate or imply that the first received network signal occurs in time before the second received network signal. Variations and modifications of the embodiments disclosed herein may be made based on the description set forth herein, without departing from the scope of the invention as set forth in the following claims.

What is claimed is:

1. A method for calibrating an isolator product, the method comprising:
receiving a calibration signal on a differential pair of nodes of a receiver signal path of a first integrated circuit die of the isolator product;
generating a diagnostic signal by providing an analog signal based on a full-wave rectified version of the calibration signal on the differential pair of nodes and converting the analog signal to a digital signal, the diagnostic signal having a level corresponding to an average amplitude of the calibration signal on the differential pair of nodes; and configuring a programmable receiver signal path based on the diagnostic signal.

2. The method as recited in claim 1 wherein the analog signal has a linear relationship to a root mean square proportional function of the full-wave rectified version of the calibration signal on the differential pair of nodes.

3. The method as recited in claim 1 further comprising reconfiguring the programmable receiver signal path based on an updated level of the diagnostic signal until a value of the diagnostic signal is less than or equal to a predetermined threshold level.

4. The method as recited in claim 3 further comprising storing a configuration code of the programmable receiver signal path in a storage element, the configuration code corresponding to the value of the diagnostic signal that is less than or equal to the predetermined threshold level.

5. The method as recited in claim 1 wherein the isolator product is configured in a diagnostic mode of operation and the method further comprises operating the isolator product in a normal mode of operation after configuring the programmable receiver signal path according to the diagnostic signal.

6. The method as recited in claim 1 wherein the diagnostic signal indicates any mismatch of an isolation channel coupled between a differential pair of receiver nodes of the first integrated circuit die and a differential pair of transmitter nodes of a second integrated circuit die of the isolator product.

7. The method as recited in claim 1 further comprising using an isolation channel to transmit a common mode test signal, the common mode test signal having a frequency of a carrier signal used to transmit data between the first integrated circuit die and a second integrated circuit die using the isolation channel in a normal mode of operation of the isolator product, the calibration signal being based on the common mode test signal received by the first integrated circuit die using the isolation channel.

8. An isolator product comprising:
   a receiver signal path having a diagnostic mode of operation and a normal mode of operation, the receiver signal path being selectively configured to receive a calibration signal on a differential pair of nodes in response to the isolator product being configured in the diagnostic mode of operation, the receiver signal path being selectively configured using a stored configuration in response to the isolator product being configured in the normal mode of operation; and
   a circuit coupled to the receiver signal path and selectively configured to generate a diagnostic signal having a level corresponding to an average amplitude of the calibration signal in response to the isolator product being configured in the diagnostic mode of operation, the stored configuration being based on the diagnostic signal, the circuit including a measurement circuit configured to generate an analog signal based on a full-wave rectified version of the calibration signal on the differential pair of nodes, and including an analog-to-digital converter circuit configured to provide a digital signal based on the analog signal.

9. The isolator product as recited in claim 8 further comprising an isolation channel coupled to a first integrated circuit die including the receiver signal path and the circuit, the stored configuration corresponding to a configuration of the receiver signal path that compensates for mismatch between the differential pair of nodes and a second differential pair of nodes of a second integrated circuit die coupled to the first integrated circuit die using the isolation channel.

10. The isolator product as recited in claim 8 wherein the analog signal has a linear relationship to a root mean square proportional function of the full-wave rectified version of the calibration signal on the differential pair of nodes.

11. The isolator product as recited in claim 8 further comprising
   an isolation channel; and
   a transmitter in a second integrated circuit die, the transmitter being selectively configured to transmit a common mode test signal having a frequency of a carrier signal used to transmit data via the isolation channel in the normal mode of operation of the isolator product, the receiver signal path being configured to receive the common mode test signal from the second integrated circuit die via the isolation channel, the calibration signal being a received version of the common mode test signal.

12. The isolator product as recited in claim 8 wherein the receiver signal path comprises a programmable resistance included in a common mode input resistor.

13. The isolator product as recited in claim 8 wherein the receiver signal path comprises:
   a first gain stage; and
   a second gain stage, the first gain stage or the second gain stage including a programmable load circuit.

14. A method for calibrating an isolator product, the method comprising:
   generating an analog signal having a linear relationship to a root mean square proportional function of a full-wave rectified version of a calibration signal on a differential pair of nodes of a first integrated circuit die, the calibration signal being based on a received version of a common mode test signal;
   providing a digital signal based on the analog signal as a diagnostic signal generated by the isolator product in a diagnostic mode of operation; and
   compensating for mismatch of an isolation channel coupled between a differential pair of receiver nodes of the first integrated circuit die of the isolator product and a differential pair of transmitter nodes of a second integrated circuit die of the isolator product based on the diagnostic signal, the diagnostic signal being indicative of the mismatch.

15. The method as recited in claim 14 wherein the compensating comprises configuring a programmable receiver signal path of the first integrated circuit die based on the diagnostic signal.

16. The method as recited in claim 15 further comprising:
   configuring the isolator product in the diagnostic mode of operation and generating the diagnostic signal; and
   configuring the isolator product in a normal mode of operation after configuring the programmable receiver signal path of the first integrated circuit die.

17. The method as recited in claim 14 further comprising transmitting the common mode test signal having a frequency of a carrier signal used to transmit data between the first integrated circuit die and the second integrated circuit die using the isolation channel in a normal mode of operation of the isolator product.

* * * * *